(12) United States Patent
Sugahara et al.

(10) Patent No.: US 11,009,535 B2
(45) Date of Patent: May 18, 2021

(54) INFORMATION PROCESSING DEVICE, NON-TRANSITORY COMPUTER-READABLE RECORDING MEDIUM, AND METHOD FOR DETERMINING AUTHENTICITY OF APPURTENANCE DEVICE

(71) Applicant: MegaChips Corporation, Osaka (JP)

(72) Inventors: Takahiko Sugahara, Osaka (JP); Harunobu Kishida, Osaka (JP)

(73) Assignee: MEGACHIPS CORPORATION, Osaka (JP)

( * ) Notice: Subject to any disclaimer, the term of this patent is extended or adjusted under 35 U.S.C. 154(b) by 371 days.

(21) Appl. No.: 16/231,679

(22) Filed: Dec. 24, 2018

(65) Prior Publication Data
US 2019/0195925 A1    Jun. 27, 2019

(30) Foreign Application Priority Data

Dec. 25, 2017  (JP) .............................. JP2017-248558

(51) Int. Cl.
| | |
|---|---|
| *G01R 21/133* | (2006.01) |
| *G01R 21/06* | (2006.01) |
| *G01R 19/00* | (2006.01) |
| *G01R 19/257* | (2006.01) |
| *G01R 19/165* | (2006.01) |
| *G06F 1/26* | (2006.01) |
| *G06F 11/30* | (2006.01) |
| *G06F 11/28* | (2006.01) |

(52) U.S. Cl.
CPC ......... *G01R 21/133* (2013.01); *G01R 19/003* (2013.01); *G01R 19/1659* (2013.01); *G01R 19/16528* (2013.01); *G01R 19/16571* (2013.01); *G01R 19/257* (2013.01); *G01R 21/06* (2013.01); *G06F 1/266* (2013.01); *G06F 11/28* (2013.01); *G06F 11/3062* (2013.01); *G06F 2201/81* (2013.01)

(58) Field of Classification Search
CPC ............ G01R 19/003; G01R 19/16528; G01R 19/16571; G01R 19/1659; G01R 19/2513; G01R 19/257; G01R 21/06; G01R 21/133; G06F 11/28; G06F 11/3062; G06F 1/266; G06F 2201/81
USPC .............................................. 702/61, 64, 82
See application file for complete search history.

(56) References Cited

U.S. PATENT DOCUMENTS

| | | | | |
|---|---|---|---|---|
| 10,474,846 B1* | 11/2019 | Rezayee | ................... | G06F 1/28 |
| 2015/0046715 A1* | 2/2015 | Ignatchenko | ......... | H04L 9/3278 |
| | | | | 713/176 |
| 2017/0293337 A1* | 10/2017 | Ittogi | ..................... | G06F 1/266 |

FOREIGN PATENT DOCUMENTS

JP           6068878 B2     1/2017

* cited by examiner

*Primary Examiner* — John H Le
(74) *Attorney, Agent, or Firm* — Xsensus LLP

(57) ABSTRACT

A circuitry is configured to calculate a measured average value based on measured current values obtained in a target period for determination, and determine whether a memory device is an authorized or an unauthorized product, based on a comparison result between a measured average value and a reference average value.

21 Claims, 9 Drawing Sheets

INFORMATION PROCESSING DEVICE, NON-TRANSITORY COMPUTER-READABLE RECORDING MEDIUM, AND METHOD FOR DETERMINING AUTHENTICITY OF APPURTENANCE DEVICE

CROSS REFERENCE TO RELATED APPLICATIONS

The present application is based on, and claims priority from Japanese Patent Application Serial Number 2017-248558, the disclosure of which is hereby incorporated by reference herein in its entirety.

BACKGROUND

Technical Field

The present disclosure relates to an information processing device, a non-transitory computer-readable recording medium, and a method for determining the authenticity of an appurtenance device.

Related Art

JP6068878B describes a memory system including an information processing device and a memory system connected thereto. The memory device measures a current consumption between the information processing device and the memory device, calculates a rate of change in the current consumption from the amount of change in the current consumption per unit time, and compares a pattern of the rate of the change in the current consumption produced for the memory device and that for an authorized product, to determine whether or not the memory device is an authorized product.

SUMMARY

An information processing device to which an appurtenance device including a plurality of processing blocks is to be connected includes circuitry configured to supply power to the appurtenance device, obtain measured current values from the information processing device to the appurtenance device, identify a pause period of the processing blocks and at least one sole operation period in which one of the processing blocks solely operates from a normal operational period of the appurtenance device, select at least one target period for determination from the pause period and the at least one sole operation period, calculate a measured average value by taking an average of the measured current values in the target period, obtain an expected value relevant to an average value of current consumption in the target period, and determine whether the appurtenance device is an authorized or an unauthorized product, based on a comparison result between a measured value relevant to the measured average value and the expected value.

A non-transitory computer-readable recording medium has recorded thereon a program configured to cause an on-board computer of an information processing device to which an appurtenance device including a plurality of processing blocks is to be connected, the information processing device including circuitry configured to supply power to the appurtenance device and measure a current from the information processing device to the appurtenance device, to perform determination of whether the appurtenance device is an authorized or an unauthorized product. The determination includes obtaining measured current values, identifying a pause period of the processing blocks and at least one sole operation period in which one of the processing blocks solely operates from a normal operational period of the appurtenance device, selecting at least one target period for determination from the pause period and the at least one sole operation period, calculating a measured average value by taking an average of the measured current values in the target period, obtaining an expected value relevant to an average value of current consumption in the target period, and determining whether the appurtenance device is an authorized or an unauthorized product, based on a comparison result between a measured value relevant to the calculated measured average value and the expected value.

A method for determining authenticity of an appurtenance device including a plurality of processing blocks and being configured to be connected to an information processing device includes supplying power to the appurtenance device, obtaining measured current values from the information processing device to the appurtenance device, identifying a pause period of the processing blocks and at least one sole operation period in which one of the processing blocks solely operates from a normal operational period of the appurtenance device, selecting at least one target period for determination from the pause period and the at least one sole operation period, calculating a measured average value by taking an average of the measured current values in the target period, obtaining an expected value relevant to an average value of current consumption in the target period, and determining whether the appurtenance device is an authorized or an unauthorized product, based on a comparison result between a measured value relevant to the calculated measured average value and the expected value.

DETAILED DESCRIPTION

Figure 1:
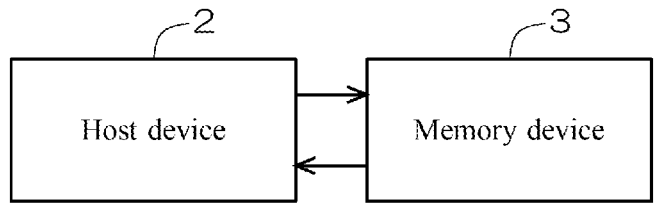
FIG. 1 is a diagram illustrating a configuration of a memory system according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing. The term "circuitry" herein may partly or entirely be implemented by using either hardware or software, or both hardware and software.

The memory system described in JP6068878B may possibly determine erroneously that a memory device connected to the information processing device, which is an inferior unauthorized product having a far greater absolute value of current consumption than an authorized product, is an authorized product, if the pattern of rates of change in current consumption of the memory device accidentally matches that of an authorized product at a measurement point of current consumption.

The present disclosure is directed to an information processing device, a non-transitory computer-readable recording medium, and a method for determining the authenticity of an appurtenance device, for achieving highly accurate authenticity determination of whether a connected appurtenance device is an authorized or an unauthorized product, even where authorized and unauthorized products have a similar pattern of rates of change in current consumption.

An information processing device to which an appurtenance device including a plurality of processing blocks is to be connected according to an aspect of the present disclosure includes a power supply unit configured to supply power to the appurtenance device, a current measurement unit configured to measure a current from the power supply unit to the appurtenance device, and a determination unit configured to determine whether the appurtenance device is an authorized or an unauthorized product. The determination unit includes a measured current value obtaining unit configured to obtain measured current values measured by the current measurement unit, a period setting unit configured to identify a pause period of the processing blocks and at least one sole operation period in which one of the processing blocks solely operates from a normal operational period of the appurtenance device and select at least one target period for determination from the pause period and the at least one sole operation period, an average calculation unit configured to calculate a measured average value that is an average of the measured current values in the target period for determination, based on the measured current values obtained by the measured current value obtaining unit in the target period for determination, an expected value obtaining unit configured to obtain expected value relevant to an average value of current consumption in the target period for determination obtained in advance for an authorized or an unauthorized product, and an authenticity determination unit configured to determine whether the appurtenance device is an authorized or an unauthorized product, based on a comparison result between a measured value relevant to the measured average value calculated by the average calculation unit and the expected value obtained by the expected value obtaining unit. The power supply unit, the current measurement unit, the determination unit, the measured current value obtaining unit, the period setting unit, the average calculation unit, the expected value obtaining unit, and the authenticity determination unit may comprise suitable logic, circuitry, interfaces, and/or code.

In the information processing device according to this aspect, the average calculation unit calculates a measured average value based on measured current values obtained by the measured current value obtaining unit in the target period for determination. The authenticity determination unit determines whether the appurtenance device is an authorized or an unauthorized product, based on a comparison result between a measured value relevant to the measured average value calculated by the average calculation unit and an expected value obtained by the expected value obtaining unit. When an authorized and an unauthorized products perform different operations in a target period for determination, the measured values of an unauthorized product (or an authorized product) differ greatly from the expected values of an authorized product (or an unauthorized product). The authenticity determination of the appurtenance device is thus facilitated. Even when an authorized and an unauthorized products perform the same operation in a target period for determination, the measured values of an unauthorized product (or an authorized product) differ from the expected values of an authorized product (or an unauthorized product) due to differences in structures and manufacturing processes of semiconductor devices between an authorized and an unauthorized products. Authenticity determination of the appurtenance device is thus facilitated. The period setting unit identifies a pause period of the processing blocks and at least one sole operation period in which one of the processing blocks solely operate from a normal operational period of the appurtenance device, and selects at least one target period for determination from the pause period and the at least one sole operation period. Setting a period during which a variation in current consumption is small as the target period for determination reduces variability of measured values and expected values relevant to the average. Moreover, flexibility in selection of a target period for determination is increased, which achieves highly accurate authenticity determination of the appurtenance device.

In some embodiments, a variation in current consumption in the sole operation period is smaller than a first threshold.

According to such embodiments, the variation in current consumption in the sole operation period is smaller than a first threshold. Thus variability of measured values and expected values relevant to an average is further reduced, which achieves further accurate authenticity determination of the appurtenance device.

In some embodiments, the expected value obtaining unit is configured to obtain a reference average value that is an average value of current consumption in a first target period for determination as the expected value. The authenticity determination unit is configured to determine whether the appurtenance device is an authorized or an unauthorized product, based on a comparison result between a measured average value in the first target period for determination and the reference average value in the first target period for determination.

According to such embodiments, the authenticity determination unit determines whether the appurtenance device is an authorized or an unauthorized product, based on a comparison result between a measured average value in the first target period for determination and a reference average value in the first target period for determination. Authenticity determination of the appurtenance device is achieved by simple processing of comparison between the measured average value and the reference average value.

In some embodiments, the period setting unit is configured to set a first period during which a variation in current consumption is larger than or equal to a second threshold as the first target period for determination.

According to such embodiments, the period setting unit selects the first period during which a variation in current consumption is larger than or equal to the second threshold for the first target period for determination. When the first period during which a variation in current consumption is relatively large is the target period for determination, even an authorized product exhibits a fairly large variability of measured average value. Simply comparing a measured average value with a reference average value, without using a maximum:minimum value of an average or a difference value therebetween, effectively prevents false determination.

In some embodiments, the processing blocks of the appurtenance device include a memory core. The memory core is configured to solely operate in the first period.

According to such embodiments, the period in which the memory core solely operates is a period during which a variation in current consumption is relatively large (larger than or equal to the second threshold and smaller than the first threshold). Authenticity determination based on a comparison result between a measured average value and a reference average value is suitably performed by selecting the sole operation period of the memory core for the first period.

In some embodiments, the expected value obtaining unit is configured to obtain an upper limit and a lower limit of a reference average value that is an average value of current consumption in a second target period for determination as the expected value. The authenticity determination unit is configured to determine whether the appurtenance device is an authorized or an unauthorized product, based on a comparison result between a maximum and a minimum of a plurality of measured average values obtained by performing measurement a plurality of times for the second target period for determination and the upper limit and the lower limit of the reference average value in the second target period for determination, respectively.

According to such embodiments, the authenticity determination unit determines whether the appurtenance device is an authorized or an unauthorized product, based on a comparison result between a maximum and a minimum of measured average values and an upper limit and a lower limit of a reference average value, respectively. Authenticity determination of the appurtenance device is achieved with high accuracy by relatively simple processing of comparing the maximum and the minimum of the measured average values with the upper limit and the lower limit of the reference average value, respectively.

In some embodiments, the period setting unit is configured to set a second period during which a variation in current consumption is larger than or equal to a third threshold and smaller than a second threshold as the second target period for determination.

According to such embodiments, the period setting unit selects the second period during which a variation in current consumption is larger than or equal to a third threshold and smaller than a second threshold for the second target period for determination. When the second period during which a variation in current consumption is relatively small is the target period for determination, a variability of measured average value is fairly small. By comparing a maximum and a minimum of measured average values with an upper limit and a lower limit of a reference average value, respectively, authenticity determination of the appurtenance device is achieved with high accuracy.

In some embodiments, the processing blocks of the appurtenance device include a digital processing circuit and a software processing unit. Either one of the digital processing circuit and the software processing unit is configured to solely operate in the second period. The software processing unit may comprise suitable logic, circuitry interfaces, and/or code.

According to such embodiments, the period in which the digital processing circuit or the software processing unit solely operates is a period during which a variation in current consumption is relatively small (larger than or equal to the third threshold and smaller than the second threshold). Authenticity determination based on a comparison result between a maximum and a minimum of measured average values and an upper limit and a lower limit of a reference average value, respectively, is suitably performed by selecting the sole operation period of the digital processing circuit or the software processing unit for the second period.

In some embodiments, the expected value obtaining unit is configured to obtain a difference between an upper limit and a lower limit of a reference average value that is an average value of current consumption in a third target period for determination as the expected value. The authenticity determination unit is configured to determine whether the appurtenance device is an authorized or an unauthorized product, based on a comparison result between a difference between a maximum and a minimum of a plurality of measured average values obtained by performing measurement a plurality of times for the third target period for determination and the difference between the upper limit and the lower limit of the reference average value in the third target period for determination.

According to such embodiments, the authenticity determination unit determines whether the appurtenance device is an authorized or an unauthorized product, based on a comparison result between a difference between a maximum and a minimum of measured average values and a difference between an upper limit and a lower limit of a reference average value. Authenticity determination of the appurtenance device is achieved with high accuracy by relatively simple processing of comparing the difference between the maximum and the minimum of the measured average values with the difference between the upper limit and the lower limit of the reference average value.

In some embodiments, the period setting unit is configured to set a third period during which a variation in current consumption is larger than or equal to a third threshold and smaller than a second threshold as the third target period for determination.

According to such embodiments, the period setting unit selects the third period during which a variation in current consumption is larger than or equal to a third threshold and smaller than a second threshold for the third target period for determination. When the third period during which a variation in current consumption is relatively small is the target period for determination, a variability of measured average value is fairly small. By comparing a difference between a maximum and a minimum of measured average values with a difference between an upper limit and a lower limit of a reference average value, authenticity determination of the appurtenance device is achieved with high accuracy.

In some embodiments, the processing blocks of the appurtenance device include a digital processing circuit and a software processing unit. Either one of the digital processing circuit and the software processing unit is configured to solely operate in the third period. The software processing unit may comprise suitable logic, circuitry, interfaces, and/or code.

According to such embodiments, the period in which the digital processing circuit or the software processing unit solely operates is a period during which a variation in current consumption is relatively small (larger than or equal to the third threshold and smaller than the second threshold). Authenticity determination based on a comparison result between a difference between a maximum and a minimum of measured average values and a difference between an upper limit and a lower limit of a reference average value is suitably performed by selecting the sole operation period of the digital processing circuit or the software processing unit for the third period.

In some embodiments, the expected value obtaining unit is configured to obtain an upper limit and a lower limit of a reference average value that is an average value of current consumption in a fourth target period for determination and a difference between the upper limit and the lower limit as the expected value. The authenticity determination unit is configured to determine whether the appurtenance device is an authorized or an unauthorized product, based on a comparison result between a maximum and a minimum of a plurality of measured average values obtained by performing measurement a plurality of times for the fourth target period for determination and the upper limit and the lower limit of the reference average value in the fourth target period for determination, respectively, and a comparison result between a difference between the maximum and the minimum and the difference between the upper limit and the lower limit.

According to such embodiments, the authenticity determination unit determines whether the appurtenance device is an authorized or an unauthorized product, based on a comparison result between a maximum and a minimum of measured average values and an upper limit and a lower limit of a reference average value, respectively, and a comparison result between a difference value between the maximum and the minimum and a difference value between the upper limit and the lower limit. Authenticity determination of the appurtenance device is achieved with high accuracy by performing authenticity determination based on two comparison results.

In some embodiments, the period setting unit is configured to set a fourth period during which a variation in current consumption is smaller than a third threshold as the fourth target period for determination.

According to such embodiments, the period setting unit selects the fourth period during which a variation in current consumption is smaller than a third threshold for the fourth target period for determination. When the fourth period during which a variation in current consumption is very small is the target period for determination, a variability of measured average value is very small. By comparing a maximum and a minimum of measured average values with an upper limit and a lower limit of a reference average value, respectively and comparing a difference between the maximum and the minimum of the measured average values with a difference between the upper limit and the lower limit of the reference average value, authenticity determination of the appurtenance device is achieved with high accuracy.

In some embodiments, the processing blocks are configured to pause in the fourth period.

According to such embodiments, the pause period in which the processing blocks pauses is a period during which a variation in current consumption is very small (smaller than the third threshold). Authenticity determination based on a comparison result between a maximum and a minimum of measured average values and an upper limit and a lower limit of a reference average value, respectively, and a comparison result between a difference between the maximum and the minimum of the measured average values and a difference between the upper limit and the lower limit of the reference average value is suitably performed by selecting the pause period for the fourth period.

In some embodiments, the expected value obtaining unit is configured to obtain the expected value for an authorized product. The period setting unit is configured to set a plurality of target periods for determination. The authenticity determination unit is configured to determine that the appurtenance device is an authorized product, if a comparison result indicates that the appurtenance device is an authorized product in all of the target periods for determination, and determine that the appurtenance device is an unauthorized product, if a comparison result indicates that the appurtenance device is not an authorized product in at least one of the target periods for determination.

According to such embodiments, the authenticity determination unit determines that the appurtenance device is an authorized product, if a comparison result indicates that the appurtenance device is an authorized product in all of the target periods for determination, while it determines that the appurtenance device is an unauthorized product, if a comparison result indicates that the appurtenance device is not an authorized product in at least one of the target periods for determination. This effectively prevents an unauthorized product from being erroneously determined to be an authorized product, when an unauthorized product exhibits current consumption characteristics different from that of an authorized product in part of a plurality of target periods for determination.

In some embodiments, the expected value obtaining unit is configured to obtain the expected value for an authorized product. The period setting unit is configured to set a plurality of target periods for determination. The authenticity determination unit is configured to determine that the appurtenance device is an authorized product, if a proportion of target periods for determination in which a comparison result indicates that the appurtenance device is an authorized product among the target periods for determination is larger than or equal to a predetermined threshold, and determines that the appurtenance device is an unauthorized product, if the proportion is smaller than the predetermined threshold.

According to such embodiments, the authenticity determination unit determines that the appurtenance device is an authorized product, if a proportion of target periods for determination in which a comparison result indicates that the appurtenance device is an authorized product among the target periods for determination is larger than or equal to a predetermined threshold, while it determines that the appurtenance device is an unauthorized product, if the proportion is smaller than the predetermined threshold. This effectively prevents an authorized product from being erroneously determined to be an unauthorized product, even when measured average value of an authorized product increases or decreases in part of target periods for determination, for example, due to unexpected noise or the like.

In some embodiments, the expected value obtaining unit is configured to obtain the expected value for an unauthorized product. The period setting unit is configured to set a plurality of target periods for determination. The authenticity determination unit is configured to determine that the appurtenance device is an unauthorized product, if a comparison result indicates that the appurtenance device is an unauthorized product in all of the target periods for determination, and determine that the appurtenance device is an authorized product, if a comparison result indicates that the appurtenance device is not an unauthorized product in at least one of the target periods for determination.

According to such embodiments, the authenticity determination unit determines that the appurtenance device is an unauthorized product, if a comparison result indicates that the appurtenance device is an unauthorized product in all of the target periods for determination, while it determines that the appurtenance device is an authorized product, if a comparison result indicates that the appurtenance device is not an unauthorized product, in at least one of the target periods for determination. This effectively prevents an authorized product from being erroneously determined to be an unauthorized product, when an authorized product exhibits current consumption characteristics different from that of an unauthorized product in part of a plurality of target periods for determination.

In some embodiments, the expected value obtaining unit is configured to obtain the expected value for an unauthorized product. The period setting unit is configured to set a plurality of target periods for determination. The authenticity determination unit is configured to determine that the appurtenance device is an unauthorized product if a proportion of target periods for determination in which a comparison result indicates that the appurtenance device is an unauthorized product among the target periods for determination is larger than or equal to a predetermined threshold, and determine that the appurtenance device is an authorized product, if the proportion is smaller than the predetermined threshold.

According to such embodiments, the authenticity determination unit determines that the appurtenance device is an unauthorized product, if a proportion of target periods for determination in which a comparison result indicates that the appurtenance device is an unauthorized product among the target periods for determination is larger than or equal to a predetermined threshold, while it determines that the appurtenance device is an authorized product, if the proportion is smaller than the predetermined threshold. This effectively prevents an unauthorized product from being erroneously determined to be an authorized product, when an unauthorized product exhibits current consumption characteristics different from that of an authorized product in part of a plurality of target periods for determination.

In some embodiments, the appurtenance device includes a storage configured to store the expected value. The information processing device includes a controller configured to read the expected value from the storage. The storage and the controller may comprise suitable logic, circuitry, interfaces, and/or code.

According to such embodiments, the expected value is stored in a storage of the appurtenance device. Different appurtenance devices have different expected values, depending on the structure of the devices, the manufacturing process, and the like. Storing an expected value obtained for a certain appurtenance device in the storage of the appurtenance device facilitates management of the expected value that differs from device to device.

A non-transitory computer-readable recording medium according to another aspect of the present disclosure has recorded thereon a program configured to cause an on-board computer of an information processing device to which an appurtenance device including a plurality of processing blocks is to be connected, the information processing device including a power supply unit configured to supply power to the appurtenance device, and a current measurement unit configured to measure a current from the power supply unit to the appurtenance device, to function as determination means configured to determine whether the appurtenance device is an authorized or an unauthorized product. The determination means includes measured current value obtaining means configured to obtain measured current values measured by the current measurement unit, period setting means configured to identify a pause period of the processing blocks and at least one sole operation period in which one of the processing blocks solely operates from a normal operational period of the appurtenance device, and select at least one target period for determination from the pause period and the at least one sole operation period, average calculation means configured to calculate a measured average value that is an average of the measured current values in the target period for determination, based on the measured current values obtained in the target period for determination by the measured current value obtaining means, expected value obtaining means configured to obtain an expected value relevant to an average value of current consumption in the target period for determination obtained in advance for an authorized or an unauthorized product, and authenticity determination means configured to determine whether the appurtenance device is an authorized or an unauthorized product, based on a comparison result between a measured value relevant to the measured average value calculated by the average calculation means and the expected value obtained by the expected value obtaining means. The power supply unit, the current measurement unit, the determination means, the measured current value obtaining means, the period setting means, the average calculation means, the expected value obtaining means, and the authenticity determination means may comprise suitable logic, circuitry, interfaces, and/or code.

In the program according to this aspect, the average calculation means calculates a measured average value based on measured current values obtained by the measured current value obtaining means in the target period for determination. The authenticity determination means determines whether the appurtenance device is an authorized or an unauthorized product, based on a comparison result between a measured value relevant to the measured average value calculated by the average calculation means and an expected value obtained by the expected value obtaining means. When an authorized and an unauthorized products perform different operations in a target period for determination, the measured values of an unauthorized product (or an authorized product) differ greatly from the expected values of an authorized product (or an unauthorized product). The authenticity determination of the appurtenance device is thus facilitated. Even when an authorized and an unauthorized products perform the same operation in a target period for determination, the measured values of an unauthorized product (or an authorized product) differ from the expected values of an authorized product (or an unauthorized product) due to differences in structures and manufacturing processes of semiconductor devices between an authorized and an unauthorized products. Authenticity determination of the appurtenance device is thus facilitated. The period setting means identifies a pause period of the processing blocks and at least one sole operation period in which one processing block solely operate from a normal operational period of the appurtenance device, and selects at least one target period for determination from the pause period and the at least one sole operation period. Setting a period during which a variation in current consumption is small as the target period for determination reduces variability of measured values and expected values relevant to the average. Moreover, flexibility in selection of a target period for determination is increased, which achieves highly accurate authenticity determination of the appurtenance device.

A method for determining authenticity of an appurtenance device according to another aspect of the present disclosure is a method for determining authenticity of an appurtenance device including a plurality of processing blocks and being configured to be connected to an information processing device including a power supply unit configured to supply power to the appurtenance device and a current measurement unit configured to measure a current from the power supply unit to the appurtenance device, of determine whether the appurtenance device is an authorized or an unauthorized product. The method includes obtaining measured current values measured by the current measurement unit, identifying a pause period of the processing blocks and at least one sole operation period in which one of the processing blocks solely operates from a normal operational period of the appurtenance device, selecting at least one target period for determination from the pause period and the at least one sole operation period, calculating a measured average value that is an average of the measured current values in the target period for determination, based on the measured current values obtained in the target period for determination, obtaining an expected value relevant to an average value of current consumption in the target period for determination obtained in advance for an authorized or an unauthorized product, and determining whether the appurtenance device is an authorized or an unauthorized product, based on a comparison result between a measured value relevant to the calculated measured average value and the obtained expected value. The power supply unit and the current measurement unit may comprise suitable logic, circuitry, interfaces, and/or code In the method for determining authenticity of an appurtenance device according to this aspect, a measured average value is calculated based on measured current values obtained in the target period for determination, and whether an appurtenance device is an authorized or an unauthorized product is determined based on a comparison result between a measured value relevant to the calculated measured average value and an obtained expected value. When an authorized and an unauthorized products perform different operations in a target period for determination, the measured values of an unauthorized product (or an authorized product) differ greatly from the expected values of an authorized product (or an unauthorized product). The authenticity determination of the appurtenance device is thus facilitated. Even when an authorized and an unauthorized products perform the same operation in a target period for determination, the measured values of an unauthorized product (or an authorized product) differ from the expected values of an authorized product (or an unauthorized product) due to differences in structures and manufacturing processes of semiconductor devices between an authorized and an unauthorized products. Authenticity determination of the appurtenance device is thus facilitated. The method includes identifying a pause period of a plurality of processing blocks and at least one sole operation period in which one processing block solely operates from a normal operational period of the appurtenance device, and selecting at least one target period for determination from the pause period and the at least one sole operation period. Setting a period during which a variation in current consumption is small as the target period for determination reduces variability of measured values and expected values relevant to the average. Moreover, flexibility in selection of a target period for determination is increased, which achieves highly accurate authenticity determination of the appurtenance device.

Some embodiments of the present disclosure achieve highly accurate determination of whether a connected appurtenance device is an authorized or an unauthorized product, even when an authorized and an unauthorized products have similar patterns of rates of change in current consumption.

These and other objects, features, aspects and advantages of the present disclosure will become more apparent from the following description of embodiments when taken in conjunction with the accompanying drawings.

DESCRIPTION OF EMBODIMENTS

Embodiments of the present disclosure are described in detail below referring to the drawings. It should be noted that identical reference numerals throughout the drawings indicate identical or equivalent elements.

FIG. 1 a diagram illustrating a configuration of a memory system 1 according to an embodiment of the present disclosure. As illustrated in FIG. 1, the memory system 1 includes a host device 2, and a memory device 3 detachably connected to the host device 2. The host device 2 is an information processing device such as a personal computer, while the memory device 3 is an appurtenance device such as a flash memory card operable with power supplied by the host device 2. In another example, the information processing device may be a printer or a multi-functional device, while the appurtenance device may be a toner cartridge. Alternatively, the information processing device may be a gaming console, while the appurtenance device may be a memory card in which a gaming program is stored.

Figure 2:
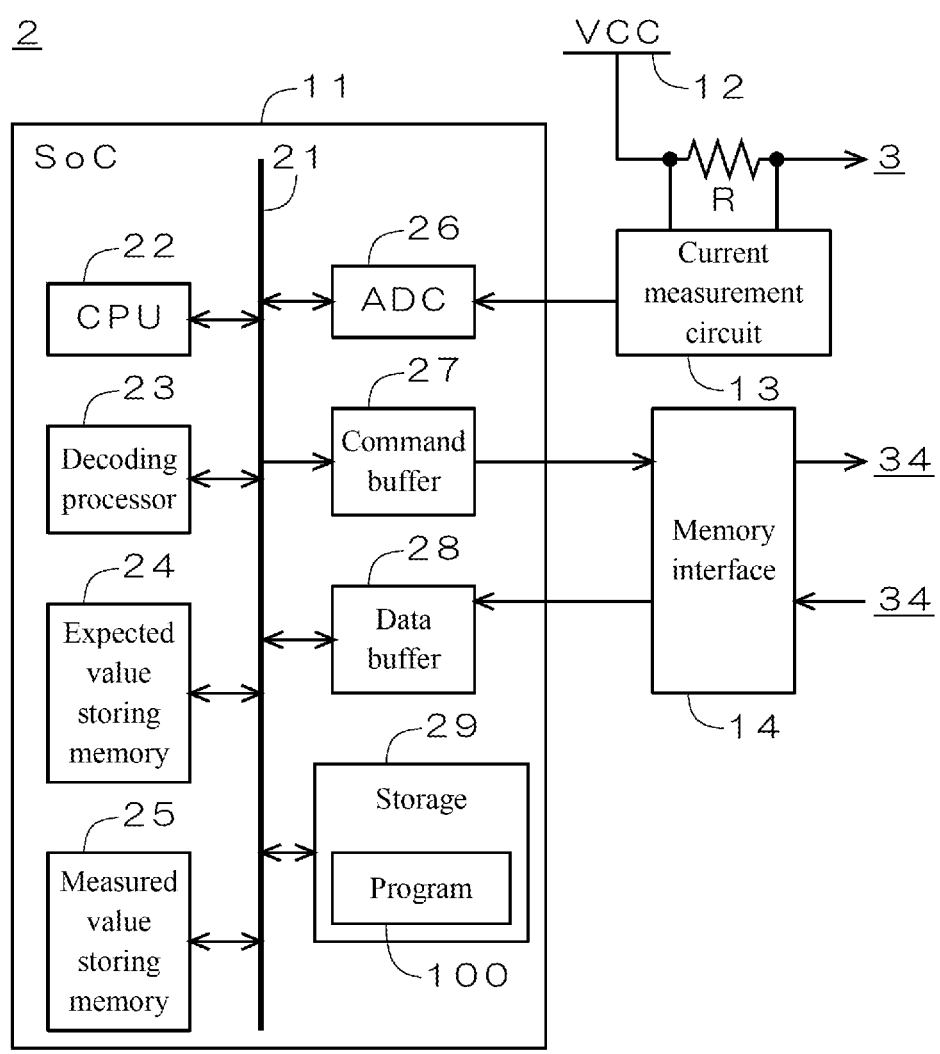
FIG. 2 is a simplified diagram illustrating a configuration of a host device.

FIG. 2 is a simplified diagram illustrating a configuration of the host device 2. As illustrated in FIG. 2, the host device 2 includes a System on a Chip (SoC) 11, a power supply unit 12, a current measurement circuit 13, and a memory interface 14. The SoC 11 includes a CPU 22, a decoding processor 23, an expected value storing memory 24, a measured value storing memory 25, an Analog to Digital Converter (ADC) 26, a command buffer 27, a data buffer 28, and a storage 29 such as ROM or RAM, connected to each other via a bus 21. The storage 29 retains a program 100. The host device 2 supplies the memory device 3 connected thereto with power to operate the memory device 3 from the power supply unit 12 via a resistance element R. The current measurement circuit 13 measures a voltage between both ends of the resistance element R to measure the value of a current passing from the power supply unit 12 to the memory device 3.

Figure 3:
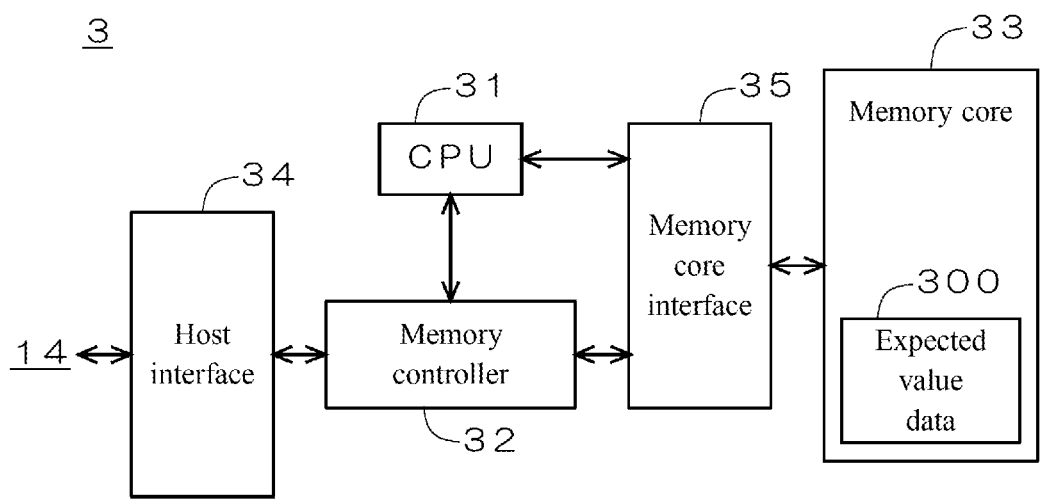
FIG. 3 is a simplified diagram illustrating a configuration of a memory device.

FIG. 3 is a simplified diagram illustrating a configuration of the memory device 3. As illustrated in FIG. 3, the memory device 3 includes a CPU 31, a memory controller 32, multiple processing blocks such as a memory core 33, a host interface 34, and a memory core interface 35. The CPU 31 serves as a software processing unit, the memory controller 32 serves as a digital processing circuit, and the memory core 33 serves as a storing unit. The memory core 33 at its specific address area retains below-described expected value data 300.

Figure 4:
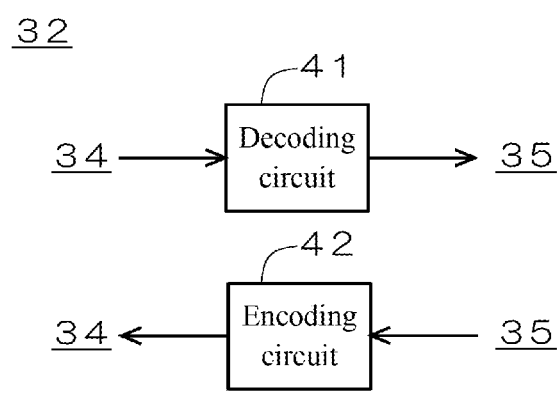
FIG. 4 is a simplified diagram illustrating a configuration of a memory controller.

FIG. 4 is a simplified diagram illustrating a configuration of the memory controller 32. As illustrated in FIG. 4, the memory controller 32 includes a decoding circuit 41 and an encoding circuit 42.

Figure 5:
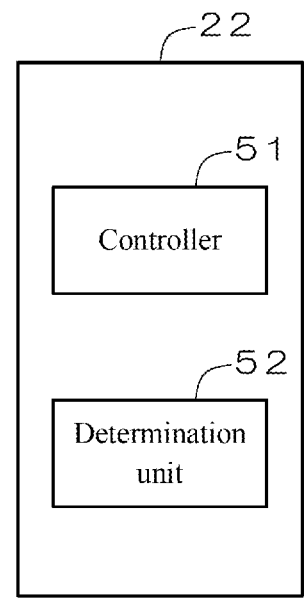
FIG. 5 is a diagram illustrating functions performed by executing a program by a CPU.

FIG. 5 is a diagram illustrating functions performed by executing the program 100 illustrated in FIG. 2 by the CPU 22. As illustrated in FIG. 2, the CPU 22 executes the program 100 read from the storage 29, to serve as a controller 51 and a determination unit 52.

Figure 6:
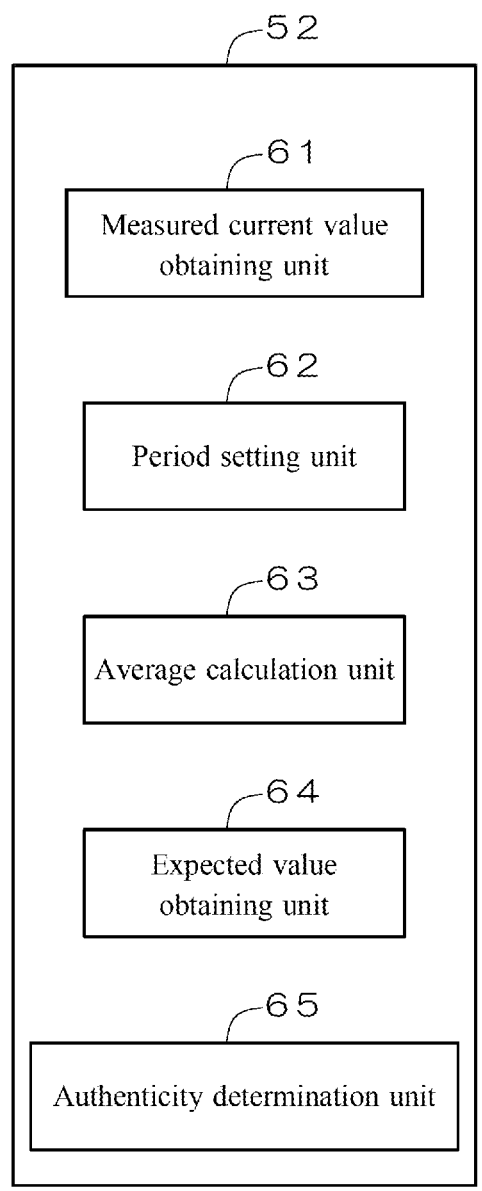
FIG. 6 is a diagram illustrating functions of a determination unit.

FIG. 6 is a diagram illustrating functions of the determination unit 52. As illustrated in FIG. 6, the determination unit 52 serves as a measured current value obtaining unit 61, a period setting unit 62, an average calculation unit 63, an expected value obtaining unit 64, and an authenticity determination unit 65.

In other words, the program 100 causes a computer in the host device 2 being an information processing device to serve as the controller 51, the measured current value obtaining unit 61, the period setting unit 62, the average calculation unit 63, the expected value obtaining unit 64, and the authenticity determination unit 65.

Figure 7:
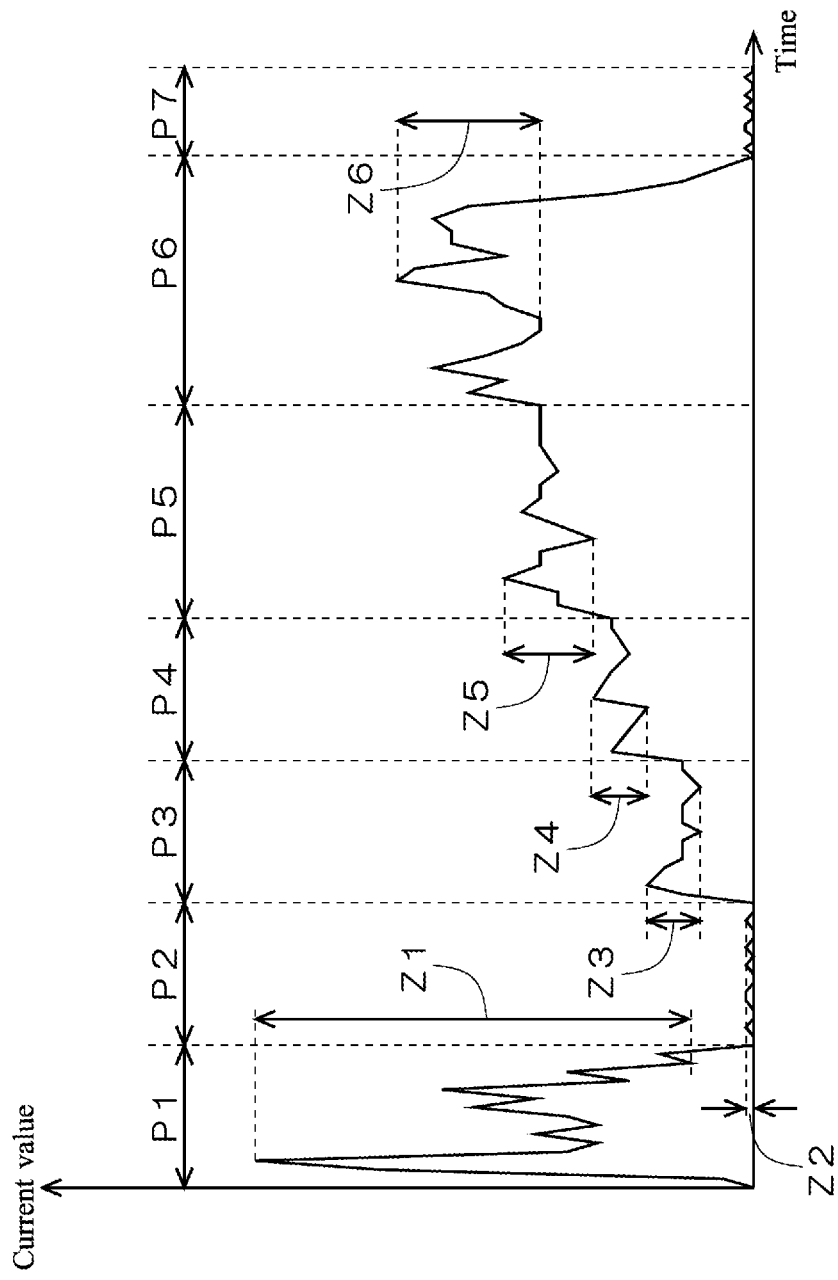
FIG. 7 is a diagram illustrating an example of current consumption characteristics of an authorized memory device.

FIG. 7 is a diagram illustrating an example of the current consumption characteristics of the memory device 3 which is an authorized product. The normal operation of the memory device 3 means processes performed in multiple periods P. In the example illustrated in FIG. 7, the normal operational period in which the normal operation is performed is divided into seven periods P1 to P7 laid in this order. For example, the period P1 is a power-on period soon after startup, the periods P2 and P7 are standby periods, the period P3 is a command decoding period for decoding a command, the period P4 is a software processing period, the period P5 is an access setup period to the memory core 33, and the period P6 is a data transfer period to the host device 2.

In the power-on period P1, a power supply to the processing blocks illustrated in FIG. 3 (CPU 31, memory controller 32, and memory core 33) is started, and thus an absolute value of current consumption by the memory device 3 and a variation Z1 thereof are very large.

In the standby periods P2 and P7, the processing blocks illustrated in FIG. 3 are all pausing an operation, and thus an absolute value of current consumption by the memory device 3 and a variation Z2 thereof are very small. The standby period (pause period) includes a waiting period in which the processing blocks illustrated in FIG. 3 are waiting for an input of a command to be received next, or an input of an interrupt instruction.

In the command decoding period P3, only the memory controller 32 among the processing blocks illustrated in FIG. 3 solely operates. An absolute value of current consumption by the memory device 3 and a variation Z3 thereof are relatively small. Referring to FIG. 4, the decoding circuit 41 decodes a read command in the command decoding period P3.

In the software processing period P4, only the CPU 31 among the processing blocks illustrated in FIG. 3 solely operates. An absolute value of current consumption by the memory device 3 and a variation Z4 thereof are relatively small. In the software processing period P4, a logical address in the read command is translated into a physical address of the memory core 33.

In the access setup period P5, only the memory core 33 among the processing blocks illustrated in FIG. 3 solely operates. An absolute value of current consumption by the memory device 3 and a variation Z5 thereof are relatively small. In the access setup period P5, a block and a page in which content data to be read out is stored are selected.

In the data transfer period P6, the memory controller 32 and the memory core 33 among the processing blocks illustrated in FIG. 3 operate. An absolute value of a current consumption by the memory device 3 and the variation Z6 thereof are relatively large. Referring to FIGS. 3 and 4, in the data transfer period P6, content data is transferred from the memory core 33 to the memory core interface 35 and from the memory core interface 35 to the memory controller 32, encoded by the encoding circuit 42, and transferred from the memory controller 32 to the host interface 34 and from the host interface 34 to the host device 2.

In the present embodiment, a target period for determination of whether the memory device 3 is an authorized or an unauthorized product is selected from the periods P1 to P7. More specifically, among the periods P1 to P7, at least one period selected from the standby period and sole operation periods in which one of the processing blocks illustrated in FIG. 3 (CPU 31, memory controller 32, and memory core 33) solely operates is set as the target period for determination. In the above sole operation periods, the variation Z in current consumption is smaller than a threshold Th1.

Figure 8:
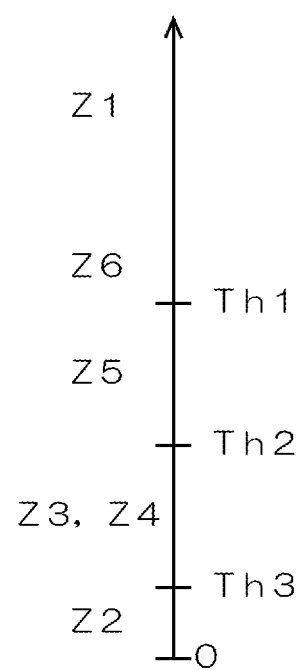
FIG. 8 is a diagram illustrating a relation between variations in current consumption and thresholds.

FIG. 8 is a diagram illustrating a relation between the variations Z1 to Z6 in current consumption and the thresholds Th1 to Th3. The threshold Th1 is set to a value between the variation Z6 in the data transfer period P6 and the variation Z5 in the access setup period P5. The threshold Th2 is a value between the variation Z5 and the variation Z3 in the command decoding period P3 or the variation Z4 in the software processing period P4. The threshold Th3 is a value between the variation Z3 or Z4 and the variation Z2 in the standby period P2.

In all of the periods P3 to P5, one processing block solely operates and the variations Z3 to Z5 are all smaller than the threshold Th1. Therefore any of the periods P3 to P5 can be set as the target period for determination. The standby periods P2 and P7 can also be set as the target period for determination.

Figure 9:
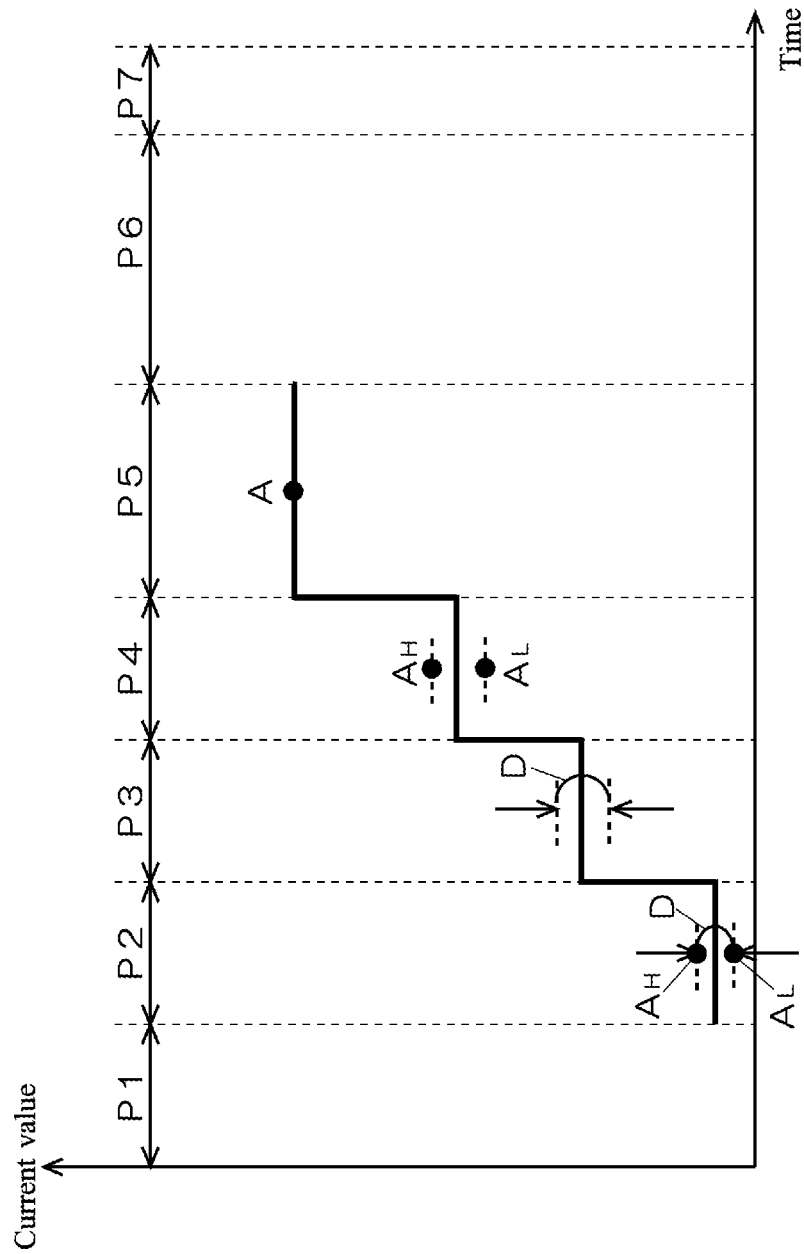
FIG. 9 is a diagram illustrating a relation between various target periods for determination and expected value data corresponding to the target periods for determination.

FIG. 9 is a diagram illustrating a relation between various target periods for determination and expected value data 300 corresponding to the target periods for determination. Authorized memory devices 3, for which the types of semiconductor devices to be implemented and the manufacturing processes of each device are strictly controlled, would show almost consistent current consumption characteristics in each of the target periods for determination. Thus information on the current consumption characteristics in each of the target periods for determination is produced before factory shipments, and stored as encoded expected value data 300 (see FIG. 3) in a specific address area of the memory core 33.

When the access setup period P5 is the target period for determination, a reference average value A in the access setup period P5 is employed as the encoded expected value data 300. More specifically, an access to a memory core of a sample memory device of an authorized product is set up before factory shipments, and current consumption values of the memory device are measured. Then an average value of current consumption in the access setup period (reference average value A) is calculated, and the reference average value A is stored as the expected value data 300 in the memory core 33 of merchandise memory devices 3.

When the software processing period P4 is the target period for determination, an upper limit $A_H$ and a lower limit $A_L$ of a reference average value A in the software processing period P4 are employed as the encoded expected value data 300. More specifically, predetermined software processing is performed on a sample memory device of an authorized product before factory shipments, and a reference average value A in the software processing period is calculated in the same way as the above. This process is repeated multiple times to calculate multiple reference average values A, and obtain the maximum and the minimum values as an upper limit $A_H$ and a lower limit $A_L$. Then the upper limit $A_H$ and the lower limit $A_L$ are stored as the expected value data 300 in the memory core 33 of merchandise memory devices 3.

When the command decoding period P3 is the target period for determination, a difference D between an upper limit $A_H$ and a lower limit $A_L$ of a reference average value A in the command decoding period P3 is employed as the encoded expected value data 300. More specifically, a command is decoded on a sample memory device of an authorized product before factory shipments, and an upper limit $A_H$ and a lower limit $A_L$ of a reference average value A in the command decoding period is obtained in the same way as the above. Then a difference D is calculated by reducing the lower limit $A_L$ from the upper limit $A_H$. Then the difference D is stored as the expected value data 300 in the memory core 33 of merchandise memory devices 3. Alternatively, the expected value data 300 for the command decoding period P3 may be obtained in the same way as the expected value data 300 for the software processing period P4, and vice versa, the expected value data 300 for the software processing period P4 may be obtained in the same way as the expected value data 300 for the command decoding period P3.

When the standby period P2 is the target period for determination, an upper limit $A_H$ and a lower limit $A_L$ of a reference average value A in the standby period P2, and a difference D between the upper limit $A_H$ and the lower limit $A_L$ in this standby period P2 are employed as the encoded expected value data 300. More specifically, a standby operation is performed on a sample memory device of an authorized product before factory shipments, and an upper limit $A_H$ and a lower limit $A_L$ of a reference average value A in the standby period and a difference D between these are obtained in the same way as the above. Then the upper limit $A_H$, the lower limit $A_L$, and the difference D are stored as the expected value data 300 in the memory core 33 of merchandise memory devices 3.

Described above is an example of employing an expected value data 300 for an authorized memory device. When an unauthorized product to be eliminated is already identified, an expected value data 300 for an unauthorized product may be stored in the memory core 33, instead of an expected value data 300 for an authorized product. For example, when the reference average value A of an authorized product is employed as the expected value data 300, whether the memory device 3 is an authorized product or not can be determined depending on whether a measured average value (described in detail below) matches the reference average value A. When the reference average value A of an unauthorized product is employed as the expected value data 300, whether the memory device 3 is an unauthorized product or not can be determined depending on whether a measured average value matches the reference average value A. The same applies to the upper limit $A_H$, the lower limit $A_L$, and the difference D.

In the example according to the present embodiment, description is given of an example of setting the access setup period P5 as the target period for determination, and employing the reference average value A of an authorized product as the expected value data 300.

Figure 10:
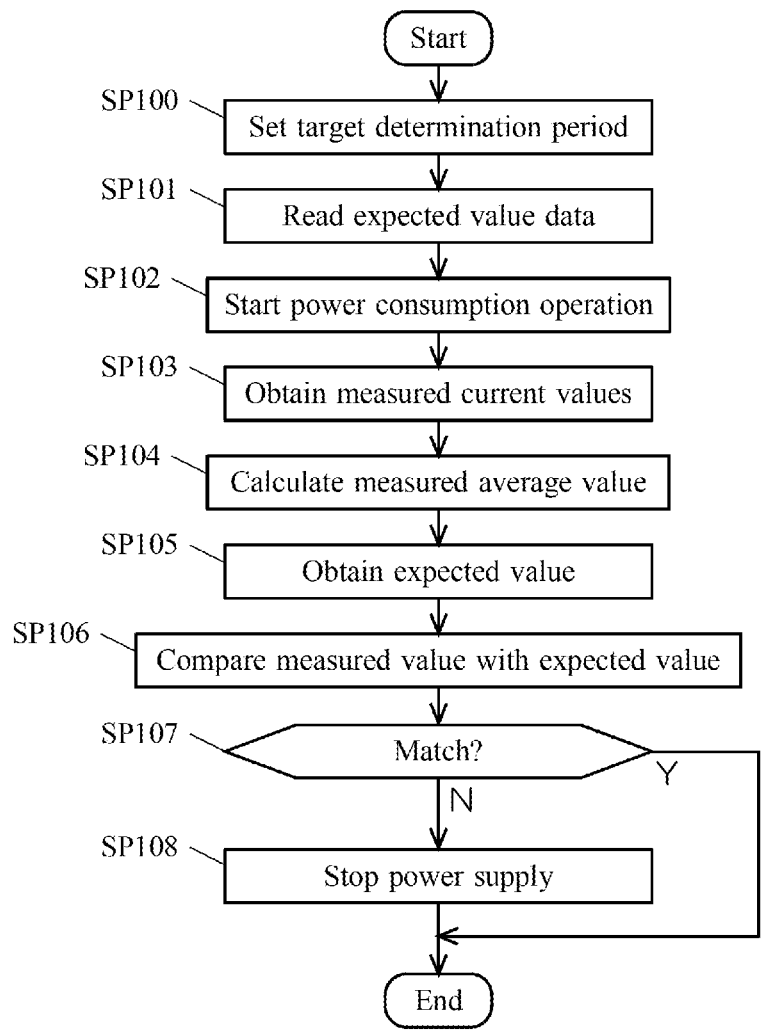
FIG. 10 is a flow chart illustrating the sequence of authenticity determination of the memory device by the host device.

FIG. 10 is a flow chart illustrating a sequence of authenticity determination of the memory device 3 by the host device 2. Authenticity determination is described in detail below with reference to FIGS. 1 to 10.

When the memory device 3 is connected to the host device 2 and the power supply unit 12 starts to supply power to the memory device 3, in Step SP100, the CPU 22 (period setting unit 62) selects at least one target period for determination in which authenticity determination is performed from the periods P1 to P7. The period setting unit 62 can statically alter the target period for determination in accordance with a preset rule, or dynamically alter the target period for determination depending on, for example, cumulative number of times authenticity determination is performed, or the operating status of the memory system 1. In the example according to the present embodiment, the period setting unit 62 sets the access setup period P5 as the target period for determination.

In Step SP101, the CPU 22 (controller 51) sets the command buffer 27 with a read command to read a desired expected value data 300 from the memory device 3. The read command is sent from the command buffer 27 via the memory interface 14 to the memory device 3. The host interface 34 inputs the read command received from the host device 2 to the decoding circuit 41. The decoding circuit 41 decodes the inputted read command and inputs the read address of the desired expected value data 300 to the memory core interface 35. The read address is input from the memory core interface 35 to the memory core 33, and thereby the desired expected value data 300 is read from the memory core 33. In the example according to the present embodiment, since the target period for determination is set to the access setup period P5, the reference average value A in the access setup period P5 and data on a corresponding predetermined tolerance are read as the desired expected value data 300 from the memory core 33. The tolerance has an optimal value within a range of plus or minus several to ten-odd percent, set in advance depending on, for example, the variation Z5 in current consumption in the access setup period P5. The read expected value data 300 is sent as encoded via the memory core interface 35 and the host interface 34 to the host device 2. The memory interface 14 inputs the expected value data 300 received from the memory device 3 to the decoding processor 23 via the data buffer 28. The decoding processor 23 decodes the encoded expected value data 300. The decoded expected value data 300 is stored in the expected value storing memory 24. In the example according to the present embodiment, the reference average value A in the access setup period P5 and data on the corresponding predetermined tolerance are stored in the expected value storing memory 24.

In Step SP102, the CPU 22 (controller 51) drives the ADC 26, and issues a read command to read a predetermined content data for authenticity determination, to cause the memory device 3 to start a power consumption operation. The read command is sent from the command buffer 27 via the memory interface 14 to the memory device 3, and received by the host interface 34. In the command decoding period P3, the decoding circuit 41 decodes the read command received from the host interface 34, and input the decoded read address to the memory core interface 35. In the software processing period P4, the CPU 31 translates the read address as a logical address into a physical address of the memory core 33. In the access setup period P5, the memory core 33 selects a block and a page in which a predetermined content data is stored, on the basis of the read address translated into a physical address. In the data transfer period P6, the memory core 33 starts to read the content data. The content data read from the memory core 33 is input via the memory core interface 35 to the encoding circuit 42. The encoding circuit 42 encodes the content data received from the memory core interface 35, and inputs the encoded content data to the host interface 34. The host interface 34 sends the content data to the host device 2.

The CPU 22 (controller 51) recognizes which of the periods P2 to P7 the memory device 3 is in, by counting time elapsed after the read command to read the above predetermined content data has been sent, or monitoring a logic state of a chip select signal.

In Step SP103, the CPU 22 (measured current value obtaining unit 61) obtains measured current values measured by the current measurement circuit 13 in the target period for determination. As the power supply from the power supply unit 12 to the memory device 3 is started, a current is fed through the resistance element R. The current measurement circuit 13 samples the voltage between both ends of the resistance element R at a predetermined sampling frequency (for example, one to several megahertz), to measure the values of a current passing from the power supply unit 12 to the memory device 3. The measured current values are amplified by a preamplifier not illustrated in the figure, A/D converted by the ADC 26, and then stored in the measured value storing memory 25. The measured current value obtaining unit 61 obtains multiple measured current values measured in the target period for determination (in this example, access setup period P5) from the measured value storing memory 25. Instead of amplifying the measured current values by the preamplifier before A/D conversion by the ADC 26, the measured current values may be A/D converted by the ADC 26 and then amplified by a multiplier.

In Step SP104, the CPU 22 (average calculation unit 63) calculates an average of the measured current values obtained in Step SP103 to obtain an average of the measured current values (measured average value) in the access setup period P5.

In Step SP105, the CPU 22 (expected value obtaining unit 64) obtains the reference average value A in the access setup period P5 and data on the corresponding predetermined tolerance from the expected value storing memory 24.

In Step SP106, the CPU 22 (authenticity determination unit 65) compares the measured average value calculated in Step SP104 with the reference average value A obtained in Step SP105. The authenticity determination unit 65 determines whether a difference between the measured average value and the reference average value A is smaller than or equal to the tolerance obtained from the expected value storing memory 24.

In Step SP107, if the difference between the measured average value and the reference average value A is smaller than or equal to the tolerance, the CPU 22 (authenticity determination unit 65) determines that the memory device 3 connected to the host device 2 is an authorized product, and terminates authenticity determination. If the difference is larger than the tolerance, the authenticity determination unit 65 determines that the memory device 3 connected to the host device 2 is an unauthorized product, and starts a process to eliminate the unauthorized memory device 3. For example, in Step SP108, power supply from the power supply unit 12 to the memory device 3 is stopped. Since unauthorized products tend to be inferior, measured average values of unauthorized products are often larger than the reference average value A of an authorized product.

In the example described above, the CPU 22 performs arithmetic computations to obtain the measured average value from the measured current values by software processing. Alternatively, these arithmetic computations may be performed by hardware processing by dedicated operating units, to avoid increase in processing load of the CPU 22 due to enormous sampling by the current measurement circuit 13.

Figure 11:
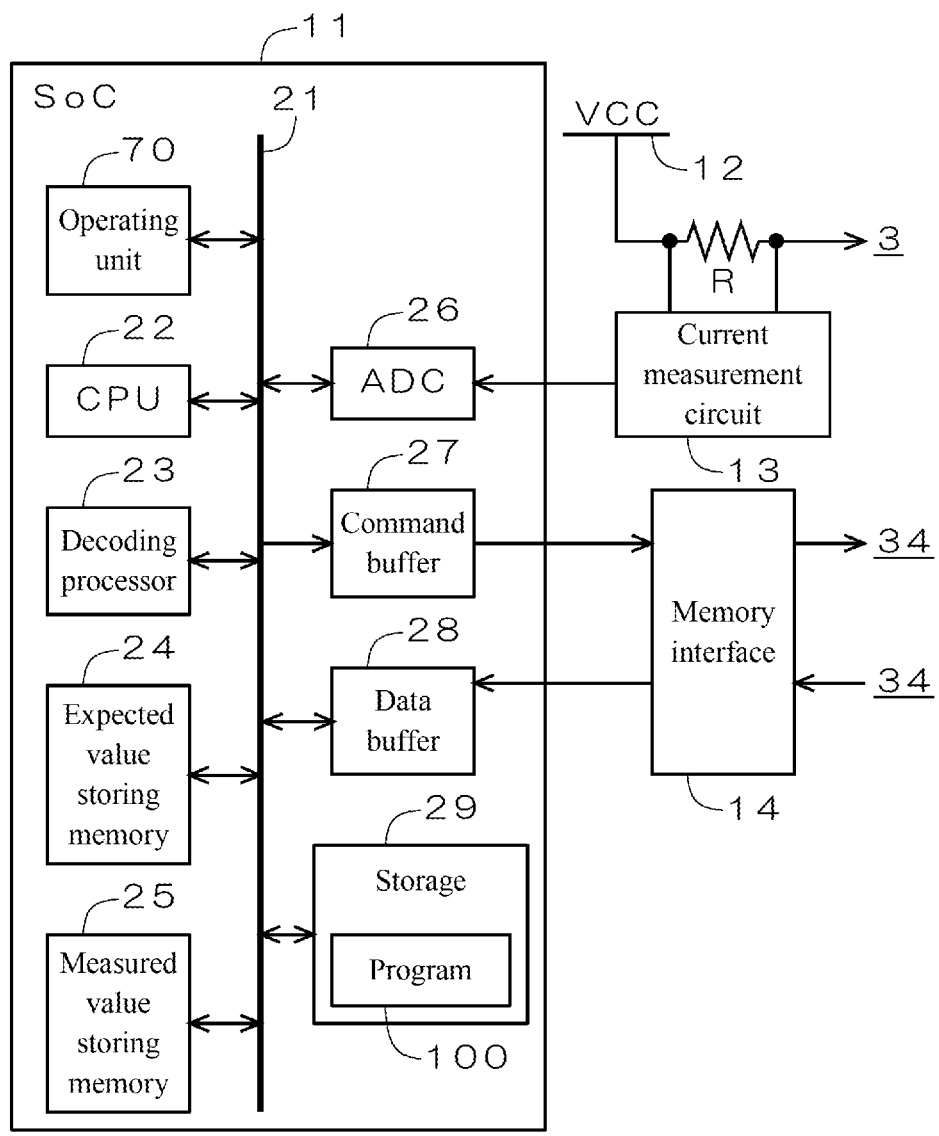
FIG. 11 is a diagram illustrating another configuration of the host device.

FIG. 11 is a diagram illustrating another configuration of the host device 2. The SoC 11 is provided with an operating unit 70 in addition to the configuration illustrated in FIG. 2. The arithmetic computations to obtain the measured average value from the measured current values are performed by the operating unit 70, and the results of these arithmetic computations are input from the operating unit 70 to the CPU 22.

As described above, in the host device 2 (information processing device) according to the present embodiment, the average calculation unit 63 calculates the measured average value on the basis of the measured current values obtained by the measured current value obtaining unit 61 in the target period for determination (in the example according to the present embodiment, the access setup period P5), and the authenticity determination unit 65 determines whether the memory device 3 (appurtenance device) is an authorized or an unauthorized product, on the basis of a comparison result between a measured value relevant to the measured average value calculated by the average calculation unit 63 (in the example according to the present embodiment, equivalent to the measured average value) and an expected value obtained by the expected value obtaining unit 64 (in the example according to the present embodiment, the reference average value A). When an authorized and an unauthorized products perform different operations in a target period for determination, the measured values of an unauthorized product (or an authorized product) differ greatly from the expected values of an authorized product (or an unauthorized product). The authenticity determination of the memory device 3 is thus facilitated. Even when an authorized and an unauthorized products perform the same operation in a target period for determination, the measured values of an unauthorized product (or an authorized product) differ from the expected values of an authorized product (or an unauthorized product) due to differences in structures and manufacturing processes of semiconductor devices between an authorized and an unauthorized products. Authenticity determination of the memory device 3 is thus facilitated. Moreover, the period setting unit 62 identifies the pause periods P2 and P7 of the multiple processing blocks (CPU 31, memory controller 32, and memory core 33) and at least one of the sole operation periods P3 to P5 in which one processing block solely operates among the normal operational periods P1 to P7 of the memory device 3, and selects at least one target period for determination (in the example according to the present embodiment, access setup period P5) from the pause periods P2 and P7 and at least one of the sole operation periods P3 to P5. Selecting the target period for determination from the pause periods P2 and P7 and at least one of the sole operation periods P3 to P5 results in setting a period during which a variation in current consumption is small as the target period for determination, which reduces variability of measured values and expected values relevant to the average. Moreover, flexibility in selection of a target period for determination is increased, which achieves highly accurate authenticity determination of the memory device 3.

In the host device 2 according to the present embodiment, the variation Z in current consumption in the above at least one of the sole operation periods P3 to P5 is smaller than a first threshold Th1. Thus variability of measured values and expected values relevant to the average is further reduced, which achieves further accurate authenticity determination of the memory device 3.

In the host device 2 according to the present embodiment, the authenticity determination unit 65 determines whether the memory device 3 is an authorized or an unauthorized product, on the basis of a comparison result between measured average value in the access setup period P5 and a reference average value A in the access setup period P5. Authenticity determination of the memory device 3 is achieved by simple processing of comparison between the measured average value and the reference average value A.

In the host device 2 according to the present embodiment, the period setting unit 62 sets the access setup period P5 (first period) during which a variation in current consumption is larger than or equal to a second threshold Th2 as the target period for determination (first target period for determination). When the access setup period P5 during which a variation in current consumption is relatively large is the target period for determination, even an authorized product exhibits a fairly large variability of measured average value. Simply comparing a measured average value with a reference average value A, without using a maximum-minimum value of an average or a difference value therebetween, effectively prevents false determination.

In the host device 2 according to the present embodiment, the access setup period P5 in which the memory core 33 solely operates is a period during which a variation in current consumption is relatively large (larger than or equal to the second threshold Th2 and smaller than the first threshold Th1). Authenticity determination based on a comparison result between a measured average value and a reference average value A is suitably performed by setting the sole operation period of the memory core 33 as the target period for determination.

In the host device 2 according to the present embodiment, the expected value data 300 is stored in the memory core 33 (storage) of the memory device 3. Different memory devices 3 have different expected value data 300, depending on the structure of the devices, the manufacturing process, and the like. Thus storing expected value data 300 obtained for a certain memory device 3 in the memory core 33 of the memory device 3 facilitates management of the expected value data 300 that differs from device to device.

Modification 1

The above embodiment is an example of setting the access setup period P5 as the target period for determination. In the present modification, description is given of an example of setting the software processing period P4 as the target period for determination.

As described above, in the software processing period P4, only the CPU 31 among the processing blocks illustrated in FIG. 3 solely operates. The absolute value of a current consumption by the memory device 3 is relatively small, and the variation Z4 thereof is also relatively small. As illustrated in FIG. 9, when the software processing period P4 is the target period for determination, an upper limit $A_H$ and a lower limit $A_L$ of a reference average value A in the software processing period P4 is stored as the encoded expected value data 300 in the memory core 33.

Referring to FIG. 10, in Step SP100, the CPU 22 (period setting unit 62) sets the software processing period P4 as the target period for determination.

In Step SP101, the CPU 22 (controller 51) reads the expected value data 300 from the memory device 3. In the present modification, the upper limit $A_H$ and the lower limit $A_L$ of the reference average value A in the software processing period P4 and data on corresponding predetermined tolerances are stored in the expected value storing memory 24.

In Step SP102, the CPU 22 (controller 51) drives the ADC 26, and causes the memory device 3 to start a power consumption operation. In Step SP103, the CPU 22 (measured current value obtaining unit 61) obtains multiple measured current values measured in the target period for determination (in the present modification, software processing period P4) from the measured value storing memory 25. In Step SP104, the CPU 22 (average calculation unit 63) calculates an average of the measured current values obtained in Step SP103 to obtain a measured average value in the software processing period P4. The CPU 22 repeats the processes in Steps SP102 to SP104 for a predetermined N times, where N is a plural number, to obtain N measured average values in the software processing period P4. Then the maximum and the minimum of the N measured average values are obtained.

In Step SP105, the CPU 22 (expected value obtaining unit 64) obtains the upper limit $A_H$ and the lower limit $A_L$, of the reference average value A in the software processing period P4 and data on the corresponding predetermined tolerance from the expected value storing memory 24.

In Step SP106, the CPU 22 (authenticity determination unit 65) compares the maximum and the minimum of the measured average values obtained in Step SP104 with the upper limit $A_H$ and the lower limit $A_L$ of the reference average value A obtained in Step SP105, respectively.

In Step SP107, if the maximum of the measured average values is smaller than or equal to a value obtained by adding the tolerance to the upper limit $A_H$ of the reference average value A and the minimum of the measured average values is larger than or equal to a value obtained by subtracting the tolerance from the lower limit $A_L$ of the reference average value A, the CPU 22 (authenticity determination unit 65) determines that the memory device 3 connected to the host device 2 is an authorized product, and terminates authenticity determination. If the maximum of the measured average values is larger than the value obtained by adding the tolerance to the upper limit $A_H$ of the reference average value A, or if the minimum of the measured average values is smaller than the value obtained by subtracting the tolerance from the lower limit $A_L$ of the reference average value A, the authenticity determination unit 65 determines that the memory device 3 connected to the host device 2 is an unauthorized product, and starts a process to eliminate the unauthorized memory device 3.

In the host device 2 according to the present modification, the authenticity determination unit 65 determines whether the memory device 3 is an authorized or an unauthorized product, on the basis of a comparison result between the maximum and the minimum of the measured average values and the upper limit $A_H$ and the lower limit $A_L$ of the reference average value A, respectively. Authenticity determination of the memory device 3 is achieved with high accuracy by relatively simple processing of comparing the maximum and the minimum of the measured average values with the upper limit and the lower limit of the reference average value A, respectively.

In the host device 2 according to the present modification, the period setting unit 62 sets the software processing period P4 (second period) during which a variation in current consumption is larger than or equal to a third threshold Th3 and smaller than the second threshold Th2 as the target period for determination (second target period for determination). When the software processing period P4 during which a variation in current consumption is relatively small is the target period for determination, a variability of measured average value is fairly small. By comparing the maximum and the minimum of the measured average values with the upper limit $A_H$ and the lower limit $A_L$ of the reference average value A, respectively, authenticity determination of the memory device 3 is achieved with high accuracy.

In the host device 2 according to the present modification, the software processing period P4 in which the CPU 31 (software processing unit) solely operates is a period during which a variation in current consumption is relatively small (larger than or equal to the third threshold Th3 and smaller than the second threshold Th2). Authenticity determination based on a comparison result between the maximum and the minimum of the measured average values and the upper limit $A_H$ and the lower limit $A_L$ of the reference average value A is suitably performed by setting the sole operation period of the CPU 31 as the target period for determination.

Modification 2

The above embodiment is an example of setting the access setup period P5 as the target period for determination. In the present modification, description is given of an example of setting the command decoding period P3 as the target period for determination.

As described above, in the command decoding period P3, only the memory controller 32 among the processing blocks illustrated in FIG. 3 solely operates. The absolute value of a current consumption by the memory device 3 is relatively small, and the variation Z3 thereof is also relatively small. As illustrated in FIG. 9, when the command decoding period P3 is the target period for determination, a difference D between an upper limit $A_H$ and a lower limit $A_L$ of a reference average value A in the command decoding period P3 is stored as the encoded expected value data 300 in the memory core 33.

Referring to FIG. 10, in Step SP100, the CPU 22 (period setting unit 62) sets the command decoding period P3 as the target period for determination.

In Step SP101, the CPU 22 (controller 51) reads the expected value data 300 from the memory device 3. In the present modification, the difference D between the upper limit $A_H$ and the lower limit $A_L$ of the reference average value A in the command decoding period P3 and data on corresponding predetermined tolerances are stored in the expected value storing memory 24.

In Step SP102, the CPU 22 (controller 51) drives the ADC 26, and causes the memory device 3 to start a power consumption operation. In Step SP103, the CPU 22 (measured current value obtaining unit 61) obtains multiple measured current values measured in the target period for determination (in the present modification, command decoding period P3) from the measured value storing memory 25. In Step SP104, the CPU 22 (average calculation unit 63) calculates an average of the measured current values obtained in Step SP103 to obtain a measured average value in the command decoding period P3. The CPU 22 repeats the processes in Steps SP102 to SP104 for a predetermined N times, to obtain N measured average values in the command decoding period P3. Then the maximum and the minimum of the N measured average values are obtained, and a difference between the maximum and the minimum is calculated.

In Step SP105, the CPU 22 (expected value obtaining unit 64) obtains the difference D between the upper limit $A_H$ and the lower limit $A_L$ of the reference average value A in the command decoding period P3 and data on the corresponding predetermined tolerance from the expected value storing memory 24.

In Step SP106, the CPU 22 (authenticity determination unit 65) compares the difference between the maximum and the minimum of the measured average value calculated in Step SP104 with the difference D between the upper limit $A_L$ and the lower limit $A_L$ of the reference average value A obtained in Step SP105.

In Step SP107, if the difference between the maximum and the minimum of the measured average values is smaller than or equal to a value obtained by adding the tolerance to the difference D between the upper limit $A_H$ and the lower limit $A_L$ of the reference average value A, the CPU 22 (authenticity determination unit 65) determines that the memory device 3 connected to the host device 2 is an authorized product, and terminates authenticity determination. If the difference between the maximum and the minimum of the measured average values is larger than the value obtained by adding the tolerance to the difference D between the upper limit Au and the lower limit $A_L$ of the reference average value A, the authenticity determination unit 65 determines that the memory device 3 connected to the host device 2 is an unauthorized product, and starts a process to eliminate the unauthorized memory device.

In the host device 2 according to the present modification, the authenticity determination unit 65 determines whether the memory device 3 is an authorized or an unauthorized product, on the basis of a comparison result between the difference between the maximum and the minimum of the measured average values and the difference D between the upper limit $A_H$ and the lower limit $A_L$ of the reference average value A. Authenticity determination of the memory device 3 is achieved with high accuracy by relatively simple processing of comparing the difference between the maximum and the minimum of the measured average values with the difference D between the upper limit $A_H$ and the lower limit $A_L$ of the reference average value A.

In the host device 2 according to the present modification, the period setting unit 62 sets the command decoding period P3 (third period) during which a variation in current consumption is larger than or equal to the third threshold Th3 and smaller than the second threshold Th2 as the target period for determination (third target period for determination). When the command decoding period P3 during which a variation in current consumption is relatively small is the target period for determination, a variability of measured average value is fairly small. By comparing the difference between the maximum and the minimum of the measured average values with the difference D between the upper limit $A_H$ and the lower limit $A_L$ of the reference average value A, authenticity determination of the memory device 3 is achieved with high accuracy.

In the host device 2 according to the present modification, the command decoding period P3 in which the memory controller 32 (digital processing circuit) solely operates is a period during which a variation in current consumption is relatively small (larger than or equal to the third threshold Th3 and smaller than the second threshold Th2). Authenticity determination based on a comparison result between the difference between the maximum and the minimum of the measured average values and the difference D between the upper limit $A_H$ and the lower limit $A_L$ of the reference average value A is suitably performed by setting the sole operation period of the memory controller 32 as the target period for determination.

Authenticity determination with the command decoding period P3 as the target period for determination may be performed in the same way as authenticity determination with the software processing period P4 as the target period for determination (Modification 1), and vice versa, authenticity determination with the software processing period P4 as the target period for determination may be performed in the same way as authenticity determination with the command decoding period P3 as the target period for determination.

Modification 3

The above embodiment is an example of setting the access setup period P5 as the target period for determination. In the present modification, description is given of an example of setting the standby period P2 as the target period for determination.

As described above, in the standby period P2, the processing blocks illustrated in FIG. 3 (CPU 31, memory controller 32, and memory core 33) are all pausing an operation. The absolute value of a current consumption by the memory device 3 is very small, and the variation Z2 thereof is also very small. As illustrated in FIG. 10, when the standby period P2 is the target period for determination, an upper limit $A_H$, a lower limit $A_L$, and a difference D of a reference average value A in the standby period P2 are stored as the encoded expected value data 300 in the memory core 33.

Referring to FIG. 10, in Step SP100, the CPU 22 (period setting unit 62) sets the standby period P2 as the target period for determination.

In Step SP101, the CPU 22 (controller 51) reads the expected value data 300 from the memory device 3. In the present modification, the upper limit $A_H$, the lower limit $A_L$, and the difference D of the reference average value A in the standby period P2 and data on corresponding predetermined tolerances are stored in the expected value storing memory 24.

In Step SP102, the CPU 22 (controller 51) drives the ADC 26, and causes the memory device 3 to start a power consumption operation. In Step SP103, the CPU 22 (measured current value obtaining unit 61) obtains multiple measured current values measured in the target period for determination (in the present modification, standby period P2) from the measured value storing memory 25. In Step SP104, the CPU 22 (average calculation unit 63) calculates an average of the measured current values obtained in Step SP103 to obtain a measured average value in the standby period P2. The CPU 22 repeats the processes in Steps SP102 to SP104 for a predetermined N times, to obtain N measured average values in the standby period P2. Then the maximum and the minimum of the N measured average values are obtained, and a difference between the maximum and the minimum is calculated.

In Step SP105, the CPU 22 (expected value obtaining unit 64) obtains the upper limit $A_H$, the lower limit $A_L$, and the difference D of the reference average value A in the standby period P2 and data on the corresponding predetermined tolerance from the expected value storing memory 24.

In Step SP106, the CPU 22 (authenticity determination unit 65) compares the maximum, the minimum, and the difference of the measured average values obtained in Step SP104 with the upper limit $A_H$, the lower limit $A_L$, and the difference D of the reference average value A obtained in Step SP105, respectively.

In Step SP107, if the maximum of the measured average values is smaller than or equal to a value obtained by adding the tolerance to the upper limit $A_H$ of the reference average value A, the minimum of the measured average values is larger than or equal to a value obtained by subtracting the tolerance from the lower limit $A_L$ of the reference average value A, and the difference between the maximum and the minimum of the measured average values is smaller than or equal to a value obtained by adding the tolerance to the difference D between the upper limit $A_H$ and the lower limit $A_L$ of the reference average value A, the CPU 22 (authenticity determination unit 65) determines that the memory device 3 connected to the host device 2 is an authorized product, and terminates authenticity determination. If the maximum of the measured average values is larger than the value obtained by adding the tolerance to the upper limit $A_H$ of the reference average value A, the minimum of the measured average values is smaller than the value obtained by subtracting the tolerance from the lower limit $A_L$ of the reference average value A, or the difference between the maximum and the minimum of the measured average values is larger than the value obtained by adding the tolerance to the difference D between the upper limit $A_H$ and the lower limit $A_L$ of the reference average value A, the authenticity determination unit 65 determines that the memory device 3 connected to the host device 2 is an unauthorized product, and starts a process to eliminate the unauthorized memory device 3.

In the host device 2 according to the present modification, the authenticity determination unit 65 determines whether the memory device 3 is an authorized or an unauthorized product, on the basis of a comparison result between the maximum, the minimum, and the difference of the measured average values and the upper limit $A_H$, the lower limit $A_L$, and the difference D of the reference average value A, respectively. Authenticity determination of the memory device 3 is achieved with high accuracy by performing authenticity determination on the basis of a comparison result between the maximum and the minimum of the measured average values and the upper limit $A_H$ and the lower limit $A_L$ of the reference average value A and a comparison result between the difference of the measured average values and the difference D of the reference average value A.

In the host device 2 according to the present modification, the period setting unit 62 sets the standby period P2 (fourth period) during which a variation in current consumption is smaller than the third threshold Th3 as the target period for determination (fourth target period for determination). When the standby period P2 during which a variation in current consumption is very small is the target period for determination, a variability of measured average value is very small. By comparing the maximum, the minimum, and the difference of the measured average values with the upper limit $A_H$, the lower limit $A_L$, and the difference D of the reference average value A, respectively, authenticity determination of the memory device 3 is achieved with high accuracy.

In the host device 2 according to the present modification, the standby period P2 is a period during which a variation in current consumption is very small (smaller than the third threshold Th3). Authenticity determination based on a comparison result between the maximum, the minimum, and the difference of the measured average values and the upper limit $A_H$, the lower limit $A_L$, and the difference D of the reference average value A, respectively, is suitably performed by setting the standby period P2 as the target period for determination.

Modification 4

The above embodiment and Modifications 1 to 3 are examples of setting only one period as the target period for determination. Multiple periods may be the target period for determination.

In the present modification, description is given of an example of setting the standby period P2, the command decoding period P3, the software processing period P4, and the access setup period P5 as the target period for determination, and employing the expected value data 300 for an authorized product.

The memory core 33 of the memory device 3 retains expected value data 300 for an authorized product set in advance by measuring a current consumption of an authorized memory device. In the present modification, the expected value data 300 includes the upper limit $A_H$, the lower limit $A_L$, and the difference D in the standby period P2, the difference D in the command decoding period P3, the upper limit $A_H$ and the lower limit $A_L$ in the software processing period P4, the reference average value A in the access setup period P5 and data on corresponding predetermined tolerances.

The CPU 22 (controller 51) reads the expected value data 300 from the memory device 3 and stores it in the expected value storing memory 24.

The CPU 22 (determination unit 52) performs the same processing as in Modification 3, to compare the maximum, the minimum, and the difference of the measured average values in the standby period P2 with the upper limit $A_H$, the lower limit $A_L$, and the difference D of the reference average value A in the standby period P2, respectively. The CPU 22 (determination unit 52) performs the same processing as in Modification 2, to compare the difference of the measured average values in the command decoding period P3 with the difference D of the reference average value A in the command decoding period P3. The CPU 22 (determination unit 52) performs the same processing as in Modification 1, to compare the maximum and the minimum of the measured average values in the software processing period P4 with the upper limit $A_H$ and the lower limit $A_L$ of the reference average value A in the software processing period P4, respectively. The CPU 22 (determination unit 52) performs the same processing as in the above embodiment, to compare the measured average value in the access setup period P5 with the reference average value A in the access setup period P5.

If comparison results for all four target periods for determination indicate that the memory device 3 is an authorized product (for example, for the access setup period P5, comparison result that the difference between the measured average value and the reference average value A is smaller than or equal to the tolerance), the CPU 22 (authenticity determination unit 65) determines that the memory device 3 is an authorized product. If a comparison result for at least one of four target periods for determination indicates that the memory device 3 is not an authorized product (for example, for the access setup period P5, a comparison result that the difference between the measured average value and the reference average value A is larger than the tolerance), the memory device 3 is determined to be an unauthorized product.

In the host device 2 according to the present modification, the authenticity determination unit 65 determines that the memory device 3 is an authorized product if comparison results indicate that the memory device 3 is an authorized product in all of multiple target periods for determination, while it determines that the memory device 3 is an unauthorized product if a comparison result indicates that the memory device 3 is not an authorized product in at least one of the multiple target periods for determination. This effectively prevents an unauthorized product from being erroneously determined to be an authorized product, when an unauthorized product exhibits current consumption characteristics different from that of an authorized product in part of multiple targets period for determination.

Alternatively, the authenticity determination unit 65 may determine that the memory device 3 is an authorized product if a proportion of target periods for determination in which a comparison result indicates that the memory device 3 is an authorized product among the multiple target periods for determination is larger than or equal to a predetermined threshold, while determining that the memory device 3 is an unauthorized product if the proportion is smaller than the predetermined threshold. The predetermined threshold has an optimal value depending on, for example, required determination accuracy, the value being at least 51% or larger. This example effectively prevents an authorized product from being erroneously determined to be an unauthorized product, even when the measured average value of an authorized product increases or decreases in part of target periods for determination, for example, due to unexpected noise or the like.

Modification 5

In Modification 4, description is given of an example of an example of employing expected value data 300 for an authorized product. In the present modification, expected value data 300 for an unauthorized product is employed.

In the present modification, description is given of an example of setting the standby period P2, the command decoding period P3, the software processing period P4, and the access setup period P5 as the target period for determination, and employing the expected value data 300 for an unauthorized product.

The memory core 33 of the memory device 3 retains expected value data 300 for an unauthorized product set in advance by measuring a current consumption of an unauthorized memory device. In the present modification, the expected value data 300 includes the upper limit $A_H$, the lower limit $A_L$, and the difference D in the standby period P2, the difference D in the command decoding period P3, the upper limit $A_H$ and the lower limit $A_L$ in the software processing period P4, the reference average value A in the access setup period P5, and data on corresponding predetermined tolerances.

The CPU 22 (controller 51) reads the expected value data 300 from the memory device 3 and stores it in the expected value storing memory 24.

The CPU 22 (determination unit 52) performs the same processing as in Modification 3, to compare the maximum, the minimum, and the difference of the measured average values in the standby period P2 with the upper limit $A_H$, the lower limit $A_L$, and the difference D of the reference average value A in the standby period P2, respectively. The CPU 22 (determination unit 52) performs the same processing as in Modification 2, to compare the difference of the measured average values in the command decoding period P3 with the difference D of the reference average value A in the command decoding period P3. The CPU 22 (determination unit 52) performs the same processing as in Modification 1, to compare the maximum and the minimum of the measured average values in the software processing period P4 with the upper limit $A_H$ and the lower limit $A_L$ of the reference average value A in the software processing period P4, respectively. The CPU 22 (determination unit 52) performs the same processing as in the above embodiment, to compare the measured average value in the access setup period P5 with the reference average value A in the access setup period P5.

If comparison results for all four target periods for determination indicates that the memory device 3 is an unauthorized product (for example, for the access setup period P5, a comparison result that the difference between the measured average value and the reference average value A is smaller than or equal to the tolerance), the CPU 22 (authenticity determination unit 65) determines that the memory device 3 is an unauthorized product. If a comparison result for at least one of four target periods for determination indicates that the memory device 3 is not an unauthorized product (for example, for the access setup period P5, a comparison result that the difference between the measured average value and the reference average value A is larger than the tolerance), the memory device 3 is determined to be an authorized product.

In the host device 2 according to the present modification, the authenticity determination unit 65 determines that the memory device 3 is an unauthorized product if comparison results indicate that the memory device 3 is an unauthorized product in all of multiple target periods for determination, while it determines that the memory device 3 is an authorized product if a comparison result indicates that the memory device 3 is not an unauthorized product in at least one of the multiple target periods for determination. This effectively prevents an authorized product from being erroneously determined to be an unauthorized product, when an authorized product exhibits current consumption characteristics different from that of an unauthorized product in part of multiple target periods for determination.

Alternatively, the authenticity determination unit 65 may determine that the memory device 3 is an unauthorized product if a proportion of target periods for determination in which a comparison result indicates that the memory device 3 is an unauthorized product among the multiple target periods for determination is larger than or equal to a predetermined threshold, while determining that the memory device 3 is an authorized product if the proportion is smaller than the predetermined threshold. The predetermined threshold has an optimal value depending on, for example, required determination accuracy, the value being at least 51% or larger. This example effectively prevents an unauthorized product from being erroneously determined to be an authorized product, even when an unauthorized product exhibits current consumption characteristics same as that of an authorized product in part of target periods for determination.

While the invention has been described in detail, the foregoing description is in all aspects illustrative and not restrictive. It is understood that numerous other modifications and variations can be devised without departing from the scope of the invention.

What is claimed is:

1. An information processing device to which an appurtenance device including a plurality of processing blocks is to be connected,
   the information processing device comprising circuitry configured to:
   supply power to the appurtenance device;
   obtain measured current values from the information processing device to the appurtenance device;
   identify a pause period of the processing blocks and at least one sole operation period in which one of the processing blocks solely operates from a normal operational period of the appurtenance device;
   select at least one target period for determination from the pause period and the at least one sole operation period;
   calculate a measured average value by taking an average of the measured current values in the target period;
   obtain an expected value relevant to an average value of current consumption in the target period; and
   determine whether the appurtenance device is an authorized or an unauthorized product, based on a comparison result between a measured value relevant to the measured average value and the expected value.

2. The information processing device according to claim 1, wherein
   a variation in current consumption in the sole operation period is smaller than a first threshold.

3. The information processing device according to claim 1, wherein the circuitry is configured to
   obtain a reference average value that is an average value of current consumption in a first target period for determination as the expected value, and
   determine whether the appurtenance device is an authorized or an unauthorized product, based on a comparison result between a measured average value in the first target period and the reference average value in the first target period.

4. The information processing device according to claim 3, wherein
   the circuitry is configured to set a first period during which a variation in current consumption is larger than or equal to a second threshold as the first target period.

5. The information processing device according to claim 4, wherein
   the appurtenance device includes a memory core as one of the processing blocks, and
   the memory core is configured to solely operate in the first period.

6. The information processing device according to claim 1, wherein the circuitry is configured to
   obtain an upper limit and a lower limit of a reference average value that is an average value of current consumption in a second target period for determination as the expected value,
   obtain a plurality of measured average values for the second target period, and
   determine whether the appurtenance device is an authorized or an unauthorized product, based on a comparison result between a maximum and a minimum of the measured average values and the upper limit and the lower limit of the reference average value in the second target period, respectively.

7. The information processing device according to claim 6, wherein
   the circuitry is configured to set a second period during which a variation in current consumption is larger than or equal to a third threshold and smaller than a second threshold as the second target period.

8. The information processing device according to claim 7, wherein
   the appurtenance device includes a digital processing circuit and a software processing circuit as the processing blocks, and
   either one of the digital processing circuit and the software processing circuit is configured to solely operate in the second period.

9. The information processing device according to claim 1, wherein the circuitry is configured to
   obtain a difference between an upper limit and a lower limit of a reference average value that is an average value of current consumption in a third target period for determination as the expected value, obtain a plurality of measured average values for the third target period, and determine whether the appurtenance device is an authorized or an unauthorized product, based on a comparison result between a difference between a maximum and a minimum of the measured average values and the difference between the upper limit and the lower limit of the reference average value in the third target period.

10. The information processing device according to claim 9, wherein
the circuitry is configured to set a third period during which a variation in current consumption is larger than or equal to a third threshold and smaller than a second threshold as the third target period.

11. The information processing device according to claim 10, wherein
the appurtenance device includes a digital processing circuit and a software processing circuit as the processing blocks, and
either one of the digital processing circuit and the software processing circuit is configured to solely operate in the third period.

12. The information processing device according to claim 1, wherein the circuitry is configured to
obtain an upper limit and a lower limit of a reference average value that is an average value of current consumption in a fourth target period for determination and a difference between the upper limit and the lower limit as the expected value,
perform measurement a plurality of times to obtain a plurality of measured average values for the fourth target period, and
determine whether the appurtenance device is an authorized or an unauthorized product, based on a comparison result between a maximum and a minimum of the measured average values and the upper limit and the lower limit of the reference average value in the fourth target period, respectively, and a comparison result between a difference between the maximum and the minimum and the difference between the upper limit and the lower limit.

13. The information processing device according to claim 12, wherein
the circuitry is configured to set a fourth period during which a variation in current consumption is smaller than a third threshold as the fourth target period.

14. The information processing device according to claim 13, wherein
the processing blocks are configured to pause in the fourth period.

15. The information processing device according to claim 1, wherein the circuitry is configured to
obtain the expected value for an authorized product;
set a plurality of target periods for determination;
determine that the appurtenance device is an authorized product, if a comparison result indicates that the appurtenance device is an authorized product in all of the target periods, and
determine that the appurtenance device is an unauthorized product, if a comparison result indicates that the appurtenance device is not an authorized product in at least one of the target periods.

16. The information processing device according to claim 1, wherein the circuitry is configured to
obtain the expected value for an authorized product;
set a plurality of target periods for determination;
determine that the appurtenance device is an authorized product, if a proportion of target periods in which a comparison result indicates that the appurtenance device is an authorized product among the target periods is larger than or equal to a predetermined threshold; and
determine that the appurtenance device is an unauthorized product, if the proportion is smaller than the predetermined threshold.

17. The information processing device according to claim 1, wherein the circuitry is configured to
obtain the expected value for an unauthorized product;
set a plurality of target periods for determination;
determine that the appurtenance device is an unauthorized product, if a comparison result indicates that the appurtenance device is an unauthorized product in all of the target periods, and
determine that the appurtenance device is an authorized product, if a comparison result indicates that the appurtenance device is not an unauthorized product in at least one of the target periods.

18. The information processing device according to claim 1, wherein the circuitry is configured to
obtain the expected value for an unauthorized product;
set a plurality of target periods for determination;
determines that the appurtenance device is an unauthorized product, if a proportion of target periods in which a comparison result indicates that the appurtenance device is an unauthorized product among the target periods is larger than or equal to a predetermined threshold; and
determine that the appurtenance device is an authorized product, if the proportion is smaller than the predetermined threshold.

19. The information processing device according to claim 1, wherein
the appurtenance device includes a storage configured to store the expected value, and
the circuitry is configured to read the expected value from the storage.

20. A non-transitory computer-readable recording medium having recorded thereon
a program configured to cause an on-board computer of an information processing device to which an appurtenance device including a plurality of processing blocks is to be connected, the information processing device including circuitry configured to supply power to the appurtenance device and measure a current from the information processing device to the appurtenance device, to perform determination of whether the appurtenance device is an authorized or an unauthorized product, the determination comprising:
obtaining measured current values;
identifying a pause period of the processing blocks and at least one sole operation period in which one of the processing blocks solely operates from a normal operational period of the appurtenance device;
selecting at least one target period for determination from the pause period and the at least one sole operation period;
calculating a measured average value by taking an average of the measured current values in the target period;
obtaining an expected value relevant to an average value of current consumption in the target period; and
determining whether the appurtenance device is an authorized or an unauthorized product, based on a comparison result between a measured value relevant to the calculated measured average value and the expected value.

21. A method for determining authenticity of an appurtenance device including a plurality of processing blocks and being configured to be connected to an information processing device, the method comprising:

supplying power to the appurtenance device;

obtaining measured current values from the information processing device to the appurtenance device;

identifying a pause period of the processing blocks and at least one sole operation period in which one of the processing blocks solely operates from a normal operational period of the appurtenance device;

selecting at least one target period for determination from the pause period and the at least one sole operation period;

calculating a measured average value by taking an average of the measured current values in the target period;

obtaining an expected value relevant to an average value of current consumption in the target period; and determine whether the appurtenance device is an authorized or an unauthorized product, based on a comparison result between a measured value relevant to the calculated measured average value and the expected value.

* * * * *